United States Patent
Sinha et al.

(10) Patent No.: US 10,911,035 B1
(45) Date of Patent: Feb. 2, 2021

(54) FIXED-WIDTH PULSE GENERATOR

(71) Applicant: NXP USA, Inc., Austin, TX (US)

(72) Inventors: Rohit Kumar Sinha, Noida (IN); Amol Agarwal, Noida (IN); Vandana Sapra, Delhi (IN)

(73) Assignee: NXP USA, INC., Austin, TX (US)

( * ) Notice: Subject to any disclaimer, the term of this patent is extended or adjusted under 35 U.S.C. 154(b) by 0 days.

(21) Appl. No.: 16/866,428

(22) Filed: May 4, 2020

(51) Int. Cl.
  *H03K 5/1252* (2006.01)
  *H03K 19/003* (2006.01)
  *H03K 5/00* (2006.01)
(52) U.S. Cl.
  CPC ..... *H03K 5/1252* (2013.01); *H03K 19/00369* (2013.01); *H03K 2005/00104* (2013.01); *H03K 2005/00234* (2013.01)
(58) Field of Classification Search
  None
  See application file for complete search history.

(56) References Cited

U.S. PATENT DOCUMENTS

| 5,696,463 | A | 12/1997 | Kwon |
| 7,288,969 | B1* | 10/2007 | Sleigh ............. H03K 5/1252 326/94 |
| 7,728,630 | B1 | 6/2010 | Ren et al. |
| 8,390,352 | B2 | 3/2013 | Seefeldt et al. |
| 10,277,213 | B1* | 4/2019 | Kimelman ......... H03K 19/21 |
| 10,491,365 | B1* | 11/2019 | Lin .............. H03L 7/0807 |
| 2004/0070433 | A1 | 4/2004 | Adams et al. |

* cited by examiner

*Primary Examiner* — Jeffery S Zweizig
(74) *Attorney, Agent, or Firm* — Rajeev Madnawat

(57) ABSTRACT

A fixed-width pulse generator includes a metastability detector circuit, a delay signal generator, and a combinational logic circuit. The metastability detector circuit is configured to receive a trigger signal and generate state detection signals. The delay signal generator is configured to receive the state detection signals and the trigger signal, and delay the trigger signal by two different delay values to generate two different delayed signals. One of the delay values is based on the state detection signals. The combinational logic circuit is configured to receive the two delayed signals and an error signal, and generate a fixed-width pulse that remains constant over process, voltage, and temperature variations.

20 Claims, 3 Drawing Sheets

US 10,911,035 B1

FIXED-WIDTH PULSE GENERATOR

BACKGROUND

The present disclosure relates generally to electronic circuits, and, more particularly, to a fixed-width pulse generator.

Pulse generators are utilized to generate a pulse signal that may be typically used for testing or programming of electronic devices. Some applications such as programming of one-time-programmable devices, require a pulse width of the pulse signal to remain constant or within pre-defined acceptable margins without which the security of the device is compromised.

Conventionally, to generate a pulse signal with a constant pulse width, a fixed-width pulse generator is implemented in a system-on-chip (SoC). The fixed-width pulse generator uses an external or internal reference clock signal to generate the pulse signal. However, utilization of the external reference clock signal may lead to leakage of secure information. Further, due to variations in process, voltage, or temperature, a frequency of both the internal and external reference clock signals changes and leads to a delay in an operation of the fixed-width pulse generator, thereby varying the pulse-width of the pulse signal. Thus, there exists a need for a fixed-width pulse generator that solves the aforementioned problems of conventional fixed-width pulse generators.

BRIEF DESCRIPTION OF THE DRAWINGS

The following detailed description of the preferred embodiments of the present disclosure will be better understood when read in conjunction with the appended drawings. The present disclosure is illustrated by way of example, and not limited by the accompanying figures, in which like references indicate similar elements.

DETAILED DESCRIPTION

Figure 1:
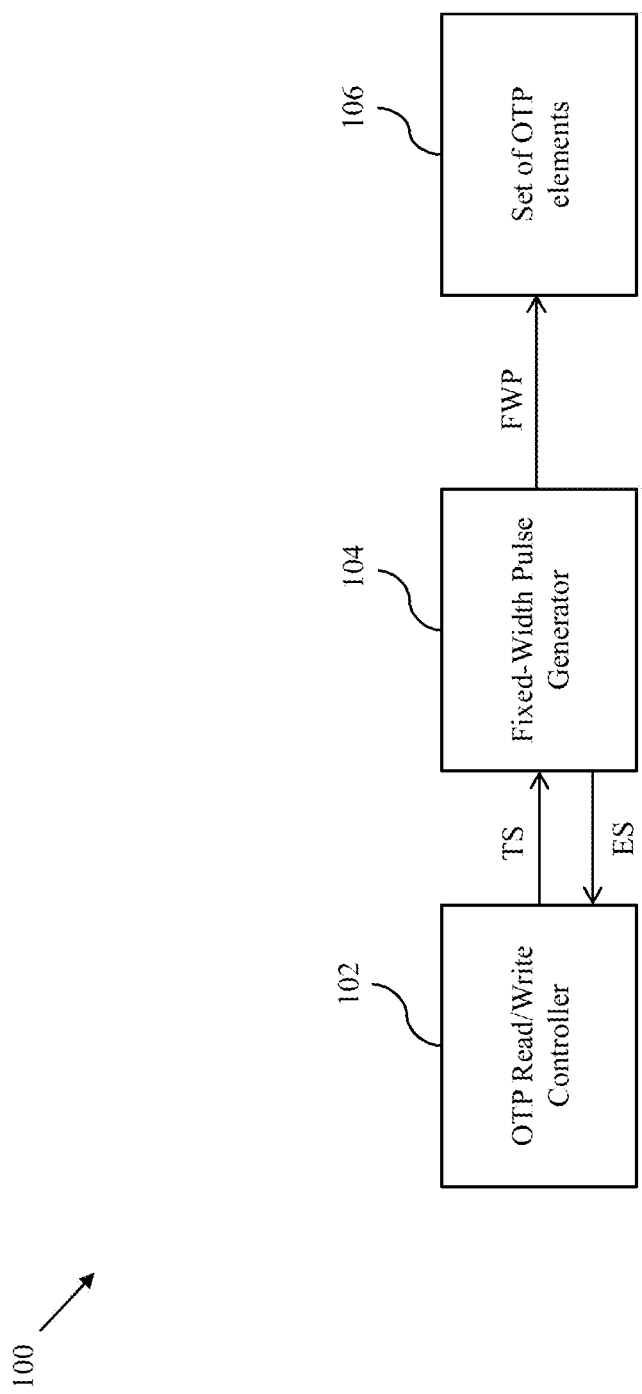
FIG. 1 is a schematic block diagram of a system-on-chip (SoC) in accordance with an embodiment of the present disclosure.

The detailed description of the appended drawings is intended as a description of the currently preferred embodiments of the present disclosure, and is not intended to represent the only form in which the present disclosure may be practiced. It is to be understood that the same or equivalent functions may be accomplished by different embodiments that are intended to be encompassed within the spirit and scope of the present disclosure.

In one embodiment, the present disclosure provides a fixed-width pulse generator. The fixed-width pulse generator includes a metastability detector circuit, a delay signal generator, and a combinational logic circuit. The metastability detector circuit is configured to receive a trigger signal and generate a plurality of state detection signals. The delay signal generator is coupled with the metastability detector circuit, and is configured to receive the plurality of state detection signals and the trigger signal, and delay the trigger signal by first and second delay values to generate first and second delayed output signals, respectively. The first delay value is based on the plurality of state detection signals. Further, the first and second delay values are different. The combinational logic circuit is coupled with the delay signal generator, and is configured to receive the first and second delayed output signals and an error signal, and generate a fixed-width pulse. A width of the fixed-width pulse remains constant over process, voltage, and temperature variations.

In another embodiment, the present disclosure provides a system-on-chip (SoC) that includes a fixed-width pulse generator and a set of one-time-programmable (OTP) elements. The fixed-width pulse generator includes a metastability detector circuit, a delay signal generator, and a combinational logic circuit. The metastability detector circuit is configured to receive a trigger signal and generate a plurality of state detection signals. The delay signal generator is coupled with the metastability detector circuit, and is configured to receive the plurality of state detection signals and the trigger signal, and delay the trigger signal by first and second delay values to generate first and second delayed output signals, respectively. The first delay value is based on the plurality of state detection signals. Further, the first and second delay values are different. The combinational logic circuit is coupled with the delay signal generator, and is configured to receive the first and second delayed output signals and an error signal, and generate a fixed-width pulse. A width of the fixed-width pulse remains constant over process, voltage, and temperature variations. The set of OTP elements is coupled with the combinational logic circuit, and is configured to receive the fixed-width pulse. Each OTP element is programmed based on the fixed-width pulse.

Various embodiments of the present disclosure provide a fixed-width pulse generator that is configured to delay a trigger signal by two different delay values to generate two different delayed output signals, respectively. The trigger signal is delayed based on multiple state detection signals such that each state detection signal is indicative of a corresponding metastable state of a corresponding metastability detector in a metastability detector circuit of the fixed-width pulse generator. One of the delay values is based on the state detection signals. Based on the two delayed output signals and an error signal, and on compensating a delay introduced due to at least one of process, voltage, and temperature (PVT) variations, the fixed-width pulse generator is further configured to generate a fixed-width pulse that has a constant width. Further, as the fixed-width pulse generator is able to generate the fixed-width pulse based on the trigger signal, a requirement of an internal or external clock signal for the generation of the fixed-width pulse is eliminated. Thus, the fixed-width pulse generator may be implemented in applications requiring secure communication of data.

Referring now to FIG. 1, a schematic block diagram of a system-on-chip (SoC) 100, in accordance with an embodiment of the present disclosure is shown. The SoC 100 may be utilized in security related applications that require secure on-chip or off-chip communication. The SoC 100 includes a one-time-programmable (OTP) read/write controller 102, a pulse generator such as a fixed-width pulse generator 104, and a set of OTP elements 106.

The OTP read/write controller 102 is coupled with the fixed-width pulse generator 104, and is configured to generate and provide a trigger signal TS to the fixed-width pulse generator 104 to program the set of OTP elements 106. The trigger signal TS triggers the fixed-width pulse generator 104 to generate a fixed-width pulse FWP when the trigger signal TS is activated. The OTP read/write controller 102 deactivates the trigger signal TS after providing the activated trigger signal TS to the fixed-width pulse generator 104. The OTP read/write controller 102 is further configured to receive an error signal ES from the fixed-width pulse generator 104. A logic state of the error signal ES indicates to the OTP read/write controller 102 whether the generation of the fixed-width pulse FWP is erroneous or error-free. Thus, based on the logic state of the error signal ES, if the OTP read/write controller 102 determines that the generation of the fixed-width pulse FAT is erroneous, the OTP read/write controller 102 activates the trigger signal TS again.

The fixed-width pulse generator 104 is configured to receive the trigger signal TS and generate the fixed-width pulse FWP such that a width of the fixed-width pulse FWP remains constant over process, voltage, and temperature variations. The fixed-width pulse generator 104 is further configured to generate the error signal ES and provide the error signal ES to the OTP read/write controller 102. In an embodiment, the error signal ES is generated at a logic high state, i.e., the error signal ES is activated, when an error is introduced during the generation of the fixed-width pulse FWP. When the generation of the fixed-width pulse FWP is error-free, the error signal ES is generated at a logic low state, i.e., the error signal ES is deactivated. Thus, when the OTP read/write controller 102 receives the error signal ES at the logic high state, the OTP read/write controller 102 activates the trigger signal TS again and provides the activated trigger signal TS to the fixed-width pulse generator 104. The fixed-width pulse generator 104 thus again generates the fixed-width pulse FWP. The fixed-width pulse generator 104 has been explained in detail in FIG. 2.

The set of OTP elements 106 is coupled with the fixed-width pulse generator 104, and is configured to receive the fixed-width pulse FWP. Each OTP element is programmed based on the fixed-width pulse FWP. Examples of the set of OTP elements 106 include, but are not limited to, electrical fuses or memories. Each OTP element may be programmed to store a chip identifier for the SoC 100, a root key for secure communication of data in the SoC 100, or the like. It will be apparent to a person skilled in the art that although in the current embodiment, the set of OTP elements 106 receive the fixed-width pulse FWP, in another embodiment, the fixed-width pulse FWP may be provided to another fixed-width pulse generator (not shown) that is coupled in series with the fixed-width pulse generator 104 to generate a clock signal (not shown) having a fixed frequency. In yet another embodiment, the fixed-width pulse generator 104 may be utilized in high speed communication interfaces to implement a delay circuit (not shown) that provides a constant delay for sampling data to be transmitted by the interface.

It will be apparent to a person skilled in the art that although in the current embodiment, the width of the fixed-width pulse FWP remains constant over process, voltage, and temperature variations, in alternate embodiments, the width of the fixed-width pulse FWP remains within a pre-defined acceptable margin such that the width remains approximately constant over process, voltage, and temperature variations.

Figure 2:
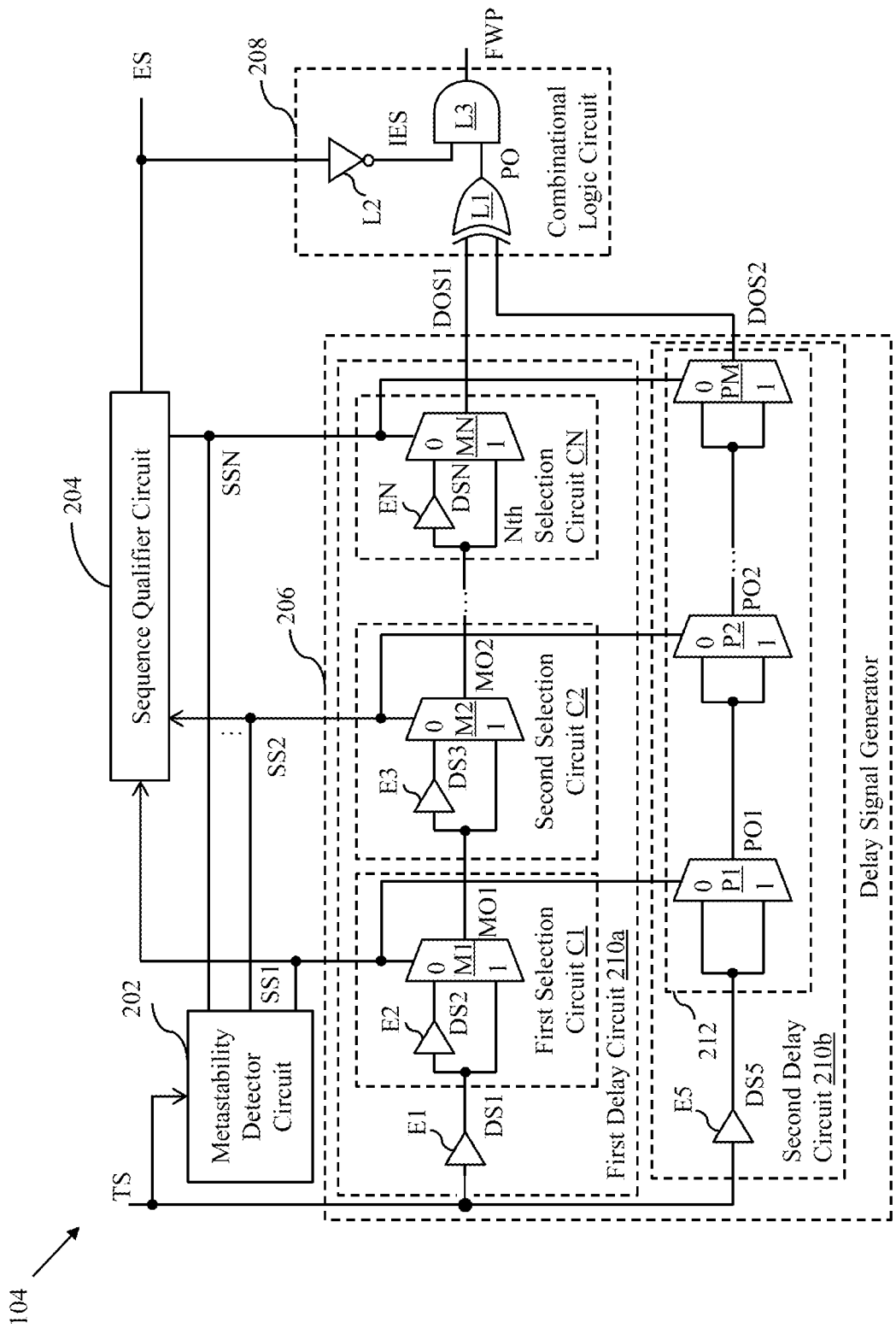
FIG. 2 is a schematic block diagram of a fixed-width pulse generator of the SoC of FIG. 1 in accordance with an embodiment of the present disclosure.

Referring now to FIG. 2, a schematic block diagram of the fixed-width pulse generator 104, in accordance with an embodiment of the present disclosure is shown. The fixed-width pulse generator 104 includes a metastability detector circuit 202, a sequence qualifier circuit 204, a delay signal generator 206, and a combinational logic circuit 208.

The metastability detector circuit 202 includes a plurality of metastability detectors (shown later in FIG. 3) such that each metastability detector includes a plurality of flip-flops (shown later in FIG. 3). The metastability detector circuit 202 is configured to receive the trigger signal TS and generate a plurality of state detection signals SS1, SS2, . . . , SSN of which first, second, and Nth state detection signals SS1, SS2, and SSN are shown. Each state detection signal, such as the first state detection signal SS1, indicates a metastable state of a corresponding metastability detector, such as a first metastability detector (shown later in FIG. 3). The metastable state of the corresponding metastability detector is determined based on outputs of the flip-flops in the metastability detector. The metastable state indicates that the outputs of the flip-flops may be unable to settle into a stable '0' or '1' logic state, i.e., a stable logic low or logic high state. The metastability detector circuit 202 has been explained in detail in FIG. 3.

The sequence qualifier circuit 204 is coupled with the metastability detector circuit 202, and is configured to receive the plurality of state detection signals SS1, SS2, . . . , SSN. The sequence qualifier circuit 204 includes suitable circuitry that is configured to execute a finite state machine (FSM) and generate the error signal ES based on a sequence of the plurality of state detection signals SS1, SS2, SSN. The FSM is executed to detect error/s in the sequence of the plurality of state detection signals SS1, SS2, . . . , SSN. Based on the detected error in the sequence, the sequence qualifier circuit 204 determines the sequence to be error-free or erroneous. The sequence is determined to be error-free when there is no transition or a single transition of '0' to '1' between subsequent state detection signals. In one example, the first and second state detection signals SS1 and SS2 are at a logic low state, and the remaining state detection signals are at a logic high state, thus the sequence received by the sequence qualifier circuit 204 is '0011'. As the received sequence includes a single transition from '0' to '1', i.e., the transition of '0' to '1' between the second state detection signal SS2 and a third state detection signal (not shown), the sequence qualifier circuit 204 determines that the sequence is error-free. When the sequence is determined to be error-free, the error signal ES is generated at the logic low state.

The sequence is determined to be erroneous when the sequence includes more than one transition from '0' to '1' between subsequent state detection signals. In an example, when the sequence is '0101', the sequence thus includes more than one transition (i.e., two transitions) from '0' to '1', i.e., the sequence '0101' includes transition from '0' to '1' between the first and second state detection signals SS1 and SS2 and transition from '0' to '1' between the third state detection signal and the Nth state detection signal SSN. Thus, the error signal ES is generated at the logic high state. The sequence qualifier circuit 204 is further coupled with the combinational logic circuit 208 and the OTP read/write controller 102 to provide the error signal ES at the logic low state or the logic high state.

The delay signal generator 206 is coupled with the metastability detector circuit 202, and is configured to receive the plurality of state detection signals SS1, SS2, . . . , SSN. The delay signal generator 206 is further coupled with the OTP Read/Write Controller 102, and is further configured to receive the trigger signal TS and delay the trigger signal TS by first and second delay values to generate first and second delayed output signals DOS1 and DOS2, respectively. The first and second delay values are different such that the first delay value is greater than the second delay value. Further, the first delay value is based on the plurality of state detection signals SS1, SS2, . . . , SSN. The delay signal generator 206 includes first and second delay circuits 210a and 210b.

The first delay circuit 210a is coupled with the metastability detector circuit 202, and is configured to receive the plurality of state detection signals SS1, SS2, . . . , SSN. The first delay circuit 210a is further coupled with the OTP Read/Write Controller 102, and is configured to receive and delay the trigger signal TS by the first delay value to generate the first delayed output signal DOS1. The first delay circuit 210a includes a first delay element E1 that is configured to receive the trigger signal TS and delay the trigger signal TS by a third delay value to generate a first delayed signal DS1. The third delay value is based on a time duration that is required by the metastability detector circuit 202 to generate the plurality of state detection signals SS1, SS2, . . . , SSN. In an embodiment, the time duration required by the metastability detector circuit 202 to generate the plurality of state detection signals SS1, SS2, . . . , SSN corresponds to a setup time of the metastability detector circuit 202. The setup time of the metastability detector circuit 202 is a time period during which the metastability detector circuit 202 receives the trigger signal TS at a logic high state and generates the plurality of state detection signals SS1, SS2, . . . , SSN at a stable state.

The first delay circuit 210a further includes a plurality of selection circuits C1, . . . , CN, of which first, second, and Nth selection circuits C1, C2, and CN are shown. For the sake of ongoing discussion and without limiting the scope of the disclosure, it is assumed that 'N' equals four. Since 'N' equals four, the first delay circuit 210a thus includes four selection circuits. The plurality of selection circuits C1, . . . , CN are coupled in series. Each selection circuit includes a delay element and a multiplexer. Thus, the first selection circuit C1 includes a second delay element E2 and a first multiplexer M1, the second selection circuit C2 includes a third delay element E3 and a second multiplexer M2, and the Nth selection circuit CN includes an Nth delay element EN and an Nth multiplexer MN.

The delay element of each selection circuit is configured to receive a corresponding first input signal that is at least one of the first delayed signal DS1 and a corresponding multiplexer output signal of a previous selection circuit of the plurality of selection circuits C1, . . . , CN that are coupled in series. In one embodiment, the delay element of each selection circuit delays the corresponding first input signal by the same value, such as a fourth delay value, to generate a corresponding delayed signal. Thus, the second delay element E2 is coupled to the first delay element E1, and is configured to receive the first delayed signal DS1 as the first input signal and delay the first delayed signal DS1 by the fourth delay value to generate a second delayed signal DS2. The second delayed signal DS2 is thus a delayed version of the first delayed signal DS1.

Each multiplexer is coupled to the corresponding delay element and the metastability detector circuit 202, and is configured to receive the corresponding delayed signal, a corresponding state detection signal of the plurality of state detection signals SS1, SS2, . . . , SSN, and the first input signal, and select and output one of the corresponding delayed signal and the first input signal based on the corresponding state detection signal. Thus, the first multiplexer M1 has a first input terminal, a second input terminal, and a select terminal that are coupled with the second delay element E2, the first delay element E1, and the metastability detector circuit 202, and are configured to receive the second delayed signal DS2, the first delayed signal DS1, and the first state detection signal SS1, respectively. The first multiplexer M1 is further configured to select and output one of the second and first delayed signals DS2 and DS1 based on the first state detection signal SS1 as a first multiplexer output signal MO1, at an output terminal thereof. In an embodiment, when the first state detection signal SS1 is at logic low and logic high states, the first multiplexer M1 selects and outputs the second and first delayed signals DS2 and DS1, respectively.

The third delay element E3 is coupled with the first selection circuit C1, and is configured to receive one of the second and first delayed signals DS2 and DS1 as the first multiplexer output signal MO1. The third delay element E3 is configured to delay one of the second and first delayed signals DS2 and DS1, by the fourth delay value, and output a third delayed signal DS3.

The second multiplexer M2 has first and second input terminals and a select terminal that are coupled to the third delay element E3, the output terminal of the first multiplexer M1, and the metastability detector circuit 202, respectively. The first and second input terminals and the select terminal of the second multiplexer M2 thus are configured to receive the third delayed signal DS3, the first multiplexer output signal MO1, and the second state detection signal SS2, respectively. Based on the second state detection signal SS2, the second multiplexer M2 is configured to select and output one of the third delayed signal DS3 and the first multiplexer output signal MO1 as a second multiplexer output signal MO2 at an output terminal thereof.

Similarly, the Nth delay element EN is configured to receive a corresponding multiplexer output signal (not shown) of the previous selection circuit, i.e., an (N−1)th selection circuit (not shown), and is configured to delay the corresponding multiplexer output signal of the (N−1)th selection circuit by the fourth delay value, and output an Nth delayed signal DSN.

The Nth multiplexer MN has first and second input terminals and a select terminal that are coupled to the Nth delay element EN, the (N−1)th selection circuit, and the metastability detector circuit 202, and are configured to receive the Nth delayed signal DSN at the first input terminal, the corresponding multiplexer output signal of the (N−1)th selection circuit at the second input terminal, and Nth state detection signal SSN at the select terminal. Based on the Nth state detection signal SSN, the Nth multiplexer MN is configured to select and output one of the Nth delayed signal DSN and the corresponding multiplexer output signal of the (N−1)th selection circuit, as the first delayed output signal DOS1, at an output terminal thereof. The multiplexer of each selection circuit thus selects one of a delayed path, i.e., the first input terminal that is coupled with a corresponding delay element, and a non-delayed path, i.e., the second input terminal with no delay element, when the corresponding state detection signal is at a logic low state and a logic high state, respectively. Further, a delay associated with each selection circuit is based on at least the fourth delay value, i.e., a delay added due to the corresponding delay element of each selection circuit.

The first delay value is hence based on the third delay value and the delay associated with each selection circuit. Further, the delay associated with each selection circuit is based on at least the fourth delay value and a delay associated with a corresponding multiplexer of each selection circuit, i.e., the selection of the delayed or non-delayed path by each selection circuit is based on the logic state of the corresponding state detection signal of the plurality of state detection signals SS1, SS2, . . . , SSN.

The second delay circuit 210b is coupled with the metastability detector circuit 202, and is configured to receive the plurality of state detection signals SS1, SS2, ..., SSN, and the trigger signal TS, and delay the trigger signal TS by the second delay value to generate the second delayed output signal DOS2. The second delay circuit 210b includes a fifth delay element E5 that is configured to receive the trigger signal TS and delay the trigger signal TS by a fifth delay value to generate a fifth delayed signal DS5. The fifth delay value is based on the time duration required by the metastability detector circuit 202 to generate the plurality of state detection signals SS1, SS2, ..., SSN. In an embodiment, the fifth delay value is same as the third delay value. The second delay circuit 210b further includes a plurality of multiplexers 212 of which third, fourth, and Mth multiplexers P1, P2, and PM are shown, that are coupled in series. In an embodiment, 'M' equals 'N', thus the second delay circuit 210b includes four multiplexers.

Each multiplexer of the plurality of multiplexers 212 is coupled with the metastability detector circuit 202, and is configured to receive a second input signal at first and second input terminals, and a corresponding state detection signal of the plurality of state detection signals SS1, SS2, ..., SSN at a select terminal, and output the second input signal based on the corresponding state detection signal at an output terminal thereof. The second input signal is at least one of the fifth delayed signal DS5 and a corresponding multiplexer output signal of a previous multiplexer of the plurality of multiplexers 212 that are coupled in series. Thus, the third multiplexer P1, the fourth multiplexer P2, and the Mth multiplexer PM are configured to receive the first, second, and Nth state detection signals SS1, SS2, and SSN, respectively.

The third multiplexer P1 has first and second input terminals that are coupled with the fifth delay element E5, and are configured to receive the fifth delayed signal DS5. Based on the first state detection signal SS1, the third multiplexer P1 is further configured to output the fifth delayed signal DS5 as a third multiplexer output signal PO1 at an output terminal thereof. In one embodiment, the third multiplexer P1 may output the fifth delayed signal DS5 as the third multiplexer output signal PO1, after delaying the fifth delayed signal DS5 by a delay associated with the third multiplexer P1.

The fourth multiplexer P2 has first and second input terminals that are coupled with the output terminal of the third multiplexer P1, and are configured to receive the third multiplexer output signal PO1. Based on the second state detection signal SS2, the fourth multiplexer P2 is further configured to output the third multiplexer output signal PO1 as a fourth multiplexer output signal PO2, at an output terminal thereof. In one embodiment, the fourth multiplexer P2 may output the third multiplexer output signal PO1 as the fourth multiplexer output signal PO2 after delaying the third multiplexer output signal PO1 by a delay associated with the fourth multiplexer P2. The delay associated with the fourth multiplexer P2 is equal to the delay associated with the third multiplexer P1.

Similarly, the Mth multiplexer PM has first and second input terminals that are coupled with the output terminal of an (M−1)th multiplexer (not shown), and are configured to receive a corresponding multiplexer output signal, i.e., an (M−1)th multiplexer output signal (not shown). The Mth multiplexer PM is further configured to output the second delayed output signal DOS2, at an output terminal thereof. The second delay value is hence based on the fifth delay value and a delay associated with each multiplexer of the plurality of multiplexers 212. Thus, the delay associated with the plurality of multiplexers 212 in the second delay circuit 210b compensates the delay associated with a corresponding multiplexer of each selection circuit in the first delay circuit 210a.

It will be apparent to a person skilled in the art that although in the current embodiment, a select terminal of each multiplexer of the plurality of multiplexers 212 is coupled with the metastability detector circuit 202 to receive the corresponding state detection signal, in an alternate embodiment, a select terminal of each multiplexer of the plurality of multiplexers 212 is coupled to a power supply generator (not shown) to receive a supply signal (not shown) at a logic low state or a logic high state.

It will further be apparent to a person skilled in the art that although in the current embodiment, the second delay circuit 210b includes the fifth delay element E5 and the plurality of multiplexers 212, in an alternate embodiment, the second delay circuit 210b includes a delay element (not shown) having a delay value that is an addition of the fifth delay value and a total delay associated with the plurality of multiplexers 212.

The combinational logic circuit 208 is coupled with the delay signal generator 206, i.e., the output of the Nth multiplexer MN and the output of the Mth multiplexer PM, and is configured to receive the first and second delayed output signals DOS1 and DOS2. The combinational logic circuit 208 is further coupled with the sequence qualifier circuit 204, and is configured to receive the error signal ES. Based on the first and second delayed output signals DOS1 and DOS2 and the error signal ES, the combinational logic circuit 208 is further configured to generate the fixed-width pulse FWP. The combinational logic circuit 208 generates the fixed-width pulse FWP when the error signal ES is at the logic low state, i.e., when the sequence of the plurality of state detection signals SS1, SS2, ..., SSN is error-free. The combinational logic circuit 208 includes first through third logic gates L1-L3.

The first logic gate L1 is coupled with the delay signal generator 206, and has first and second input terminals that are configured to receive the first and second delayed output signals DOS1 and DOS2, respectively. The first logic gate L1 further has an output terminal that is configured to generate a pulse output signal PO. The second logic gate L2 is coupled with the sequence qualifier circuit 204, and has an input terminal that is configured to receive the error signal ES, and an output terminal that is configured to generate an inverted error signal IES. The third logic gate L3 is coupled with the first and second logic gates L1 and L2, and has first and second input terminals that are configured to receive the pulse output signal PO and the inverted error signal IES at first and second input terminals, respectively. The third logic gate L3 further has an output terminal that is configured to generate and output the fixed-width pulse FWP. The third logic gate L3 generates the fixed-width pulse FWP when the error signal ES is at the logic low state, i.e., when the inverted error signal IES is at a logic high state, and does not generate the fixed-width pulse FWP when the error signal ES is at the logic high state, i.e., when the inverted error signal IES is at a logic low state. As the fixed-width pulse FWP is not generated when the error signal ES is at the logic high state, thus the error in the sequence does not induce errors in the width of the fixed-width pulse FWP. In an embodiment, the first logic gate L1 is an exclusive OR (XOR) gate, the second logic gate L2 is a NOT gate, and the third logic gate L3 is an AND gate.

Figure 3:
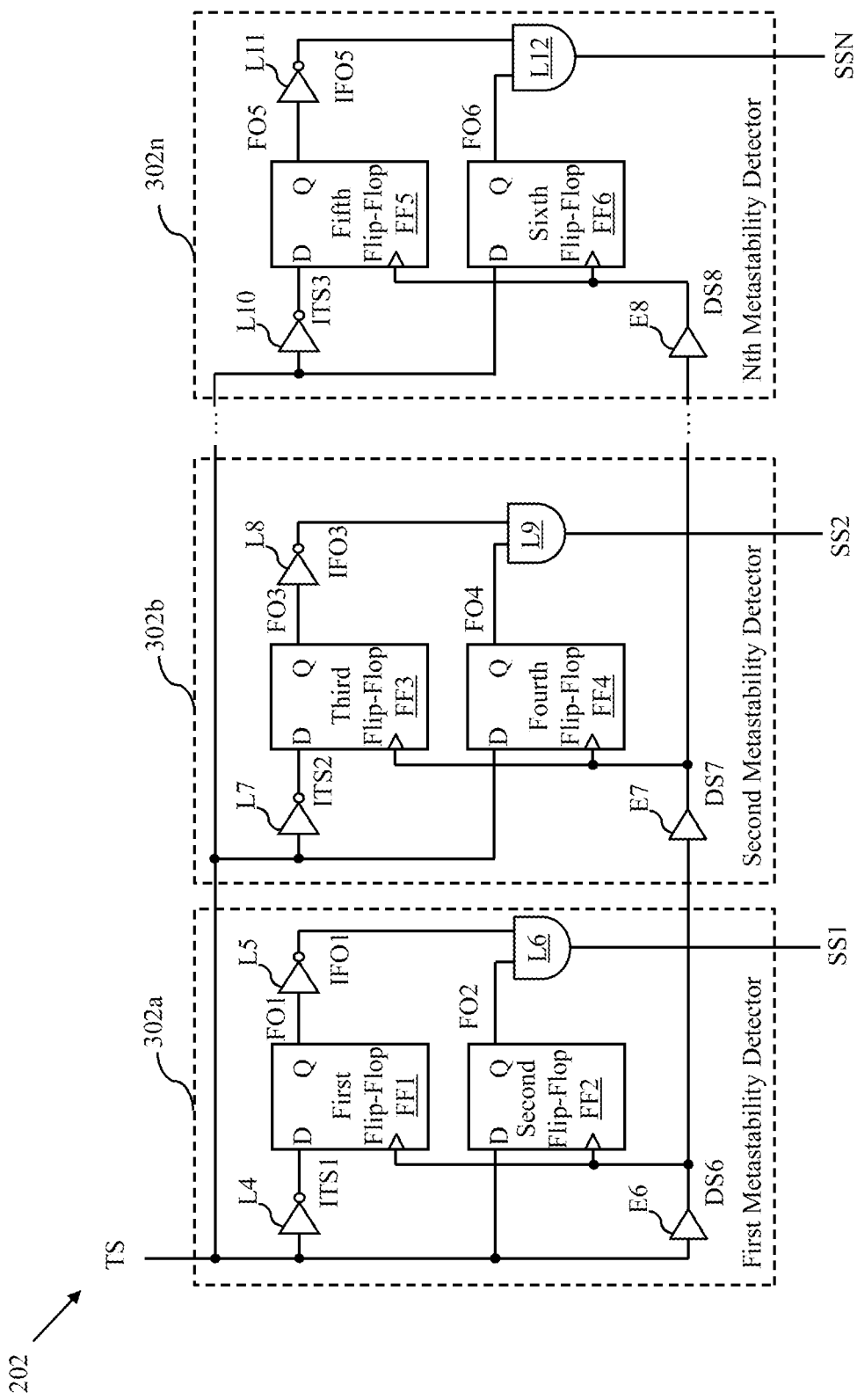
FIG. 3 is a schematic block diagram of a metastability detector circuit of the fixed-width pulse generator of FIG. 2 in accordance with an embodiment of the present disclosure.

Referring now to FIG. 3, a schematic block diagram of the metastability detector circuit 202, in accordance with an embodiment of the present disclosure is shown. The metastability detector circuit 202 includes a plurality of metastability detectors 302a-302n that are coupled in parallel, of which first, second, and Nth metastability detectors 302a, 302b, and 302n, are shown. In an embodiment, each metastability detector includes a delay element, a plurality of logic gates, and a plurality of flip-flops. Further, each metastability detector receives a third input signal that is at least one of the trigger signal TS and a corresponding delayed signal of a previous metastability detector of the plurality of metastability detectors 302a-302n that are coupled in parallel. It will be apparent to a person skilled in the art that each metastability detector may include 'X' number of flip-flops for detecting the metastable state, where 'X' is greater than or equal to two. In the presently preferred embodiment, 'X' is two and thus each metastability detector includes two flip-flops. It will further be apparent to a person skilled in the art that when the number of flip-flops in each metastability detector increases, a number of logic gates in the metastability detector increases proportionately.

It will be understood by those of skilled in the art that as a number of flip-flops in each metastability detector increases, an accuracy of each metastability detector to detect the metastable state increases. It will further be understood by those of skilled in the art that as a number of metastability detectors in the metastability detector circuit 202 increases, an accuracy of the fixed-width pulse generator 104 to generate the fixed-width pulse FIAT having a constant width increases.

The first metastability detector 302a includes fourth through sixth logic gates L4-L6, first and second flip-flops FF1 and FF2, and a sixth delay element E6. The sixth delay element E6 and an input terminal of the fourth logic gate L4 are coupled with the OTP read/write controller 102. The sixth delay element E6 is thus configured to receive the trigger signal TS as the third input signal and delay the third input signal by a sixth delay value to generate a sixth delayed signal DS6. Further, the fourth logic gate L4 is configured to receive the trigger signal TS. The fourth logic gate L4 further has an output terminal that is configured to generate a first inverted trigger signal ITS1.

The first flip-flop FF1 has input and clock terminals that are coupled with the fourth logic gate L4 and the sixth delay element E6, and are configured to receive the first inverted trigger signal ITS1 and the sixth delayed signal DS6, respectively. The first flip-flop FF1 further has an output terminal that is configured to generate a first flop-output signal FO1. The second flip-flop FF2 has input and clock terminals that are coupled with the OTP read/write controller 102 and the sixth delay element E6, and are configured to receive the trigger signal TS and the sixth delayed signal DS6, respectively. The second flip-flop FF2 further has an output terminal that is configured to generate a second flop-output signal FO2.

The fifth logic gate L5 has an input terminal that is coupled with the output terminal of the first flip-flop FF1, and is configured to receive the first flop-output signal FO1. The fifth logic gate L5 further has an output terminal that is configured to generate an inverted first flop-output signal IFO1. The sixth logic gate L6 has first and second input terminals that are coupled with the output terminals of the fifth logic gate L5 and the second flip-flop FF2, and are configured to receive the inverted first flop-output signal IFO1 and the second flop-output signal FO2, respectively. The sixth logic gate L6 further has an output terminal that is configured to generate a corresponding state detection signal, i.e., the first state detection signal SS1, of the plurality of state detection signals SS1, SS2, . . . , SSN. When at least one of the first and second flip-flops FF1 and FF2 are in the metastable state, i.e., the first and second flop-output signals FO1 and FO2 are unable to settle into a stable '0' or '1' logic state, the first state detection signal SS1 is thus generated at the logic low state. Further, when both the first and second flip-flops FF1 and FF2 are in a stable state, i.e., the first and second flop-output signals FO1 and FO2 are able to settle into a stable '0' or '1' logic state, the first state detection signal SS1 is thus generated at the logic high state.

The second metastability detector 302b includes seventh through ninth logic gates L7-L9, third and fourth flip-flops FF3 and FF4, and a seventh delay element E7. The seventh delay element E7 is coupled with the sixth delay element E6, and is configured to receive the sixth delayed signal DS6 as the third input signal and delay the sixth delayed signal DS6 by a seventh delay value to generate a seventh delayed signal DS7. In one embodiment, the sixth and seventh delay values are same. The seventh logic gate L7 has an input terminal that is coupled with the OTP read/write controller 102, and is configured to receive the trigger signal TS. The seventh logic gate L7 further has an output terminal that is configured to generate a second inverted trigger signal ITS2. It will be apparent to a person skilled in the art that although in the current embodiment, the seventh delay element E7 is coupled with the sixth delay element E6 and receives the sixth delayed signal DS6, in an alternate embodiment, the seventh delay element E7 is coupled with the OTP read/write controller 102, receives the trigger signal TS, and delays the trigger signal TS by the seventh delay value such that the seventh delay value is twice the sixth delay value.

The third and fourth flip-flops FF3 and FF4 are structurally and functionally similar to the first flip-flop FF1. The third and fourth flip-flops FF3 and FF4 have input terminals that are coupled with the output terminal of the seventh logic gate L7 and the OTP read/write controller 102, respectively, and are configured to receive the second inverted trigger signal ITS2 and the trigger signal TS, respectively. The third and fourth flip-flops FF3 and FF4 further have clock terminals that are coupled with the seventh delay element E7, and are configured to receive the seventh delayed signal DS7, and output terminals that are configured to generate third and fourth flop-output signals FO3 and FO4, respectively.

The eighth and ninth logic gates L8 and L9 are structurally and functionally similar to the fifth and sixth logic gates L5 and L6, respectively. The eighth logic gate L8 thus has an input terminal that is coupled with the output terminal of the third flip-flop FF3, and is configured to receive the third flop-output signal FO3. The eighth logic gate L8 further has an output terminal that is configured to generate an inverted third flop-output signal IFO3. The ninth logic gate L9 has first and second input terminals that are coupled with the output terminals of the eighth logic gate L8 and the fourth flip-flop FF4, and are configured to receive the inverted third flop-output signal IFO3 and the fourth flop-output signal FO4, respectively. The ninth logic gate L9 further has an output terminal that is configured to generate the second state detection signal SS2. Further, when at least one of the third and fourth flip-flops FF3 and FF4 are in the metastable state, the second state detection signal SS2 is generated at a logic low state, and when both the third and fourth flip-flops FF3 and FF4 are in the stable state, the second state detection signal SS2 is generated at a logic high state.

The Nth metastability detector 302n includes tenth through twelfth logic gates L10-L12, fifth and sixth flip-flops FF5 and FF6, and an eighth delay element E8. The tenth and eleventh logic gates L10 and L11 are structurally and functionally similar to the fourth logic gate L4, the twelfth logic gate L12 is structurally and functionally similar to the sixth logic gate L6, and the fifth and sixth flip-flops FF5 and FF6 are structurally and functionally similar to the first flip-flop FF1. The eighth delay element E8 is coupled with the previous metastability detector, i.e., an (N−1)th metastability detector (not shown) in the parallel combination, and is configured to receive and delay a corresponding delayed signal (not shown) of the previous metastability detector by an eighth delay value to generate an eighth delayed signal DS8.

The tenth logic gate L10 has an input terminal that is coupled with the OTP read/write controller 102, and is configured to receive the trigger signal TS. The tenth logic gate L10 further has an output terminal that is configured to generate a third inverted trigger signal ITS3.

The fifth and sixth flip-flops FF5 and FF6 have input terminals that are coupled with the output terminal of the tenth logic gate L10 and the OTP read/write controller 102, respectively, and are configured to receive the third inverted trigger signal ITS3 and the trigger signal TS, respectively. The fifth and sixth flip-flops FF5 and FF6 further have clock terminals that are coupled with the eighth delay element E8, and are configured to receive the eighth delayed signal DS8. The fifth and sixth flip-flops FF5 and FF6 further have output terminals that are configured to generate fifth and sixth flop-output signals FO5 and FO6, respectively.

The eleventh logic gate L11 has an input terminal that is coupled with the output terminal of the fifth flip-flop FF5, and is configured to receive the fifth flop-output signal FO5. The eleventh logic gate L11 further has an output terminal that is configured to generate an inverted fifth flop-output signal IFO5. The twelfth logic gate L12 has first and second input terminals that are coupled with the output terminals of the eleventh logic gate L11 and the sixth flip-flop FF6, and are configured to receive the inverted fifth flop-output signal IFO5 and the sixth flop-output signal FO6, respectively. The twelfth logic gate L12 further has an output terminal that is configured to generate the Nth state detection signal SSN. Further, when at least one of the fifth and sixth flip-flops FF5 and FF6 are in the metastable state, the Nth state detection signal SSN is generated at a logic low state, and when both the fifth and sixth flip-flops FF5 and FF6 are in the stable state, the Nth state detection signal SSN is generated at a logic high state. In an embodiment, the first through sixth flip-flops FF1-FF6 are D flip-flops, the fourth, fifth, seventh, eighth, tenth, and eleventh logic gates L4, L5, L7, L8, L10, and L11 are NOT gates, and the sixth, ninth, and twelfth logic gates L6, L9, and L12 are AND gates.

In operation, the OTP read/write controller 102 generates the trigger signal TS at the logic high state, i.e., activates the trigger signal TS, and provides the activated trigger signal TS to the metastability detector circuit 202. The metastability detector circuit 202 is thus triggered to generate the plurality of state detection signals SS1, SS2, ..., SSN, i.e., the plurality of metastability detectors 302a-302n are thus triggered to generate the plurality of state detection signals SS1, SS2, ..., SSN, respectively, when the trigger signal TS is activated. The first through sixth flip-flops FF1-FF6 receive a corresponding delayed signal at their respective clock terminals. A delay value associated with the corresponding delayed signal increases from the first metastability detector 302a to the Nth metastability detector 302n due to a series connection of the plurality of metastability detectors 302a-302n. In an example, the first and second metastability detectors 302a and 302b are in a metastable state, i.e., the first and second state detection signals SS1 and SS2 are at the logic low state, and the remaining two metastability detectors are in a stable state, thus the remaining two state detection signals are at the logic high state, leading to a single transition from '0' to '1' between the second state detection signal SS2 and an (N−1)th state detection signal (not shown). Thus, the sequence is '0011', and is error-free.

Based on the received sequence, the plurality of selection circuits C1, ..., CN select one of the delayed and non-delayed paths. Thus, the first and second selection circuits C1 and C2 select the delayed path as the first and second state detection signals SS1 and SS2 are at the logic low state, and the (N−1)th selection circuit and Nth selection circuit CN select the non-delayed path as the (N−1)th state detection signal and the Nth state detection signal SSN are at the logic high state. The first and second delay circuits 210a and 210b thus generate the first and second delayed output signals DOS1 and DOS2, respectively, based on which the combinational logic circuit 208 generates the fixed-width pulse FWP. The width of the fixed-width pulse FWP is given by an equation (1) below:

$$\text{Width} = N*D \qquad (1)$$

where,

N represents a number of selection circuits that selected the delayed path, and

D represents a delay value of the delay element in each selection circuit. In an embodiment, D represents the fourth delay value of the second through Nth delay elements E2, E3, ..., EN.

If there is variation in at least one of process, voltage, and temperature, then a first delay factor is introduced during generation of the fixed-width pulse FWP by the fixed-width pulse generator 104. Thus, a corresponding delay value of the delay elements, such as the sixth, seventh, and eighth delay elements E6, E7, and E8, in each metastability detector changes by the first delay factor. Further, a number of metastability detectors of the plurality of metastability detectors 302a-302n that are in metastable state varies, thereby varying the sequence of the plurality of state detection signals SS1, SS2, ..., SSN. In the example, when the sequence is '0011', due to the variation in at least one of process, voltage, and temperature, the second metastability detector 302b transitions from the metastable state to the stable state, i.e., the second state detection signal SS2 transitions from the logic low state to the logic high state, thereby generating a new sequence '0111'. As the sequence varies, a number of selection circuits that select the delayed path varies. Thus, the second selection circuit C2 selects the non-delayed path. As the first delay factor introduced during the generation of the fixed-width pulse FWP is compensated by varying the number of selection circuits that select the delayed path, the width of the fixed-width pulse FWP remains same as the width of the fixed-width pulse FWP when there is no variation in process, voltage, and temperature. The variation in the number of selection circuits that select the delayed path is given by an equation (2) below:

$$N*D = (N-x)*D*k1 \qquad (2)$$

where, k1 represents the first delay factor introduced by the variation in at least one of process, voltage, and temperature, and x represents a number of selection circuits that select the non-delayed path.

The equation (2) describes that before the variation in at least one of process, voltage, and temperature, there are 'N' selection circuits, i.e., two selection circuits, that select the delayed path and the width of the fixed-width pulse FWP is 'N D', and after the variation in at least one of process, voltage, or temperature, there are 'N−x' selection circuits, i.e., one selection circuit, that select the delayed path and the width of the fixed-width pulse FWP is '(N−x) D k1'. Thus, the first delay factor k1 is compensated as 'x' selection circuits select the non-delayed path.

The number of selection circuits that select the non-delayed path is given by an equation (3) below:

$$x = N*(k1-1)/k1 \tag{3}$$

Thus, to generate the fixed-width pulse FWP with the same pulse width, 'x' number of selection circuits select the non-delayed path, i.e., x' number of metastability detectors remain in metastable state. For example, when the first metastability detector 302a is in the metastable state, the first selection circuit C1 selects the non-delayed path. Thus, remaining 'N−x' number of metastability detectors are in stable state, i.e., satisfy the setup time of the metastability detector circuit 202, which is given by an equation (4) below:

$$p(N-x)*d*k1 = dv \tag{4}$$

where,
p(N−x) represents the number of delay elements of the plurality of selection circuits C1, ..., CN that are used to generate the first delayed output signal DOS1,
d represents a delay value of the delay element in each metastability detector, and
dv represents the setup time.

Based on the equations (3) and (4), the number of delay elements of the plurality of selection circuits C1, ..., CN used to generate the first delayed output signal DOS1 is given by an equation (5) below:

$$p(t) = dv * \frac{t}{d*N} \tag{5}$$

where,
t represents the number of selection circuits that select the non-delayed path, and
p(t) represents the number of delay elements of the plurality of selection circuits C1, ..., CN used to generate the first delayed output signal DOS1.

Similarly, if the variation in at least one of the process, voltage, and temperature, introduces a delay factor in the setup time due to which the setup time deviates from the typical setup time, the number of delay elements of the plurality of selection circuits C1, ..., CN used to generate the first delayed output signal DOS1 is given by an equation (6) below:

$$p(t) = dv * k2 * \frac{t}{d*N} \tag{6}$$

where,
k2 represents a second delay factor, i.e., the delay factor in the setup time.

The fixed-width pulse generator 104 thus generates the fixed-width pulse FWP having a constant width over process, voltage, and temperature variations, by varying a number of selection circuits selecting the delayed path or the non-delayed path based on the corresponding state detection signal. Thus, the first delay value before and after the variation in process, voltage, and temperature remains same. A difference between the first and second delay values equals the width of the fixed-width pulse FWP. Further, the third delay value and the delay associated with the multiplexer of each selection circuit in the first delay circuit 210a is compensated by the fifth delay value and the delay associated with the plurality of multiplexers 212 in the second delay circuit 210b, such that the difference between the first and second delay values remains constant. Thus, the width of the fixed-width pulse FWP remains constant, i.e., the width of the fixed-width pulse FWP is resilient to the variations in at least one of process, voltage, and temperature.

The fixed-width pulse generator 104 generates the fixed-width pulse FWP having a constant width that is utilized for programming the set of OTP elements 106. As the fixed-width pulse generator 104 generates the fixed-width pulse FWP based on the trigger signal TS, a requirement of an internal or external clock signal for the generation of the fixed-width pulse FWP is eliminated. Thus, the fixed-width pulse generator 104 may be implemented in security related applications. Further, the width of the fixed-width pulse FWP remains constant over process, voltage, and temperature variations as the delay (such as the first and second delay factors) introduced during the generation of the fixed-width pulse FWP is compensated by varying the number of delay elements of the plurality of selection circuits C1, ..., CN used to generate the first delayed output signal DOS1.

While various embodiments of the present disclosure have been illustrated and described, it will be clear that the present disclosure is not limited to these embodiments only. Numerous modifications, changes, variations, substitutions, and equivalents will be apparent to those skilled in the art, without departing from the spirit and scope of the present disclosure, as described in the claims.

The invention claimed is:

1. A fixed-width pulse generator, comprising:
a metastability detector circuit that is configured to receive a trigger signal and generate a plurality of state detection signals;
a delay signal generator that is coupled with the metastability detector circuit, and is configured to receive the plurality of state detection signals and the trigger signal, and delay the trigger signal by first and second delay values to generate first and second delayed output signals, respectively, wherein the first delay value is based on the plurality of state detection signals, and wherein the first and second delay values are different; and
a combinational logic circuit that is coupled with the delay signal generator, and is configured to receive the first and second delayed output signals and an error signal, and generate a fixed-width pulse, wherein a width of the fixed-width pulse remains constant over process, voltage, and temperature variations.

2. The fixed-width pulse generator of claim 1, further comprising:
a sequence qualifier circuit that is coupled with the metastability detector circuit and the combinational logic circuit, and is configured to receive the plurality of state detection signals, generate the error signal based on a sequence of the plurality of state detection signals, and provide the error signal to the combinational logic circuit.

3. The fixed-width pulse generator of claim 2, wherein the combinational logic circuit comprises:
   a first logic gate that is coupled with the delay signal generator, and is configured to receive the first and second delayed output signals and generate a pulse output signal;
   a second logic gate that is coupled with the sequence qualifier circuit, and is configured to receive the error signal and generate an inverted error signal; and
   a third logic gate that is coupled with the first and second logic gates, and is configured to receive the pulse output signal and the inverted error signal, and generate the fixed-width pulse.

4. The fixed-width pulse generator of claim 3, wherein the first logic gate is an exclusive OR (XOR) gate, the second logic gate is a NOT gate, and the third logic gate is an AND gate.

5. The fixed-width pulse generator of claim 2, wherein the error signal is generated at a logic high state when the sequence of the plurality of state detection signals is erroneous, and at a logic low state when the sequence of the plurality of state detection signals is error-free, and wherein the combinational logic circuit generates the fixed-width pulse when the error signal is at the logic low state.

6. The fixed-width pulse generator of claim 1, wherein the metastability detector circuit comprises:
   a plurality of metastability detectors that are coupled in parallel, wherein each state detection signal indicates a metastable state of a corresponding metastability detector of the plurality of metastability detectors, and wherein each metastability detector comprises:
      a first delay element that is configured to receive a first input signal and delay the first input signal by a third delay value to generate a first delayed signal, wherein the first input signal is at least one of the trigger signal and a corresponding delayed signal of a previous metastability detector of the plurality of metastability detectors that are coupled in parallel;
      a fourth logic gate that is configured to receive the trigger signal and generate an inverted trigger signal;
      a plurality of flip-flops that include first and second flip-flops, wherein the first flip-flop is coupled with the first delay element and the fourth logic gate, and is configured to receive the first delayed signal and the inverted trigger signal, and generate a first flop-output signal, and wherein the second flip-flop is coupled with the first delay element, and is configured to receive the first delayed signal and the trigger signal, and generate a second flop-output signal;
      a fifth logic gate that is coupled with the first flip-flop, and is configured to receive the first flop-output signal and generate an inverted first flop-output signal; and
      a sixth logic gate that is coupled with the fifth logic gate and the second flip-flop, and is configured to receive the inverted first flop-output signal and the second flop-output signal, and generate a corresponding state detection signal of the plurality of state detection signals, wherein when at least one of the first and second flip-flops are in the metastable state, the corresponding state detection signal is generated at a logic low state.

7. The fixed-width pulse generator of claim 6, wherein the plurality of metastability detectors are triggered to generate the plurality of state detection signals when the trigger signal is activated.

8. The fixed-width pulse generator of claim 1, wherein the delay signal generator comprises:
   a first delay circuit that is coupled with the metastability detector circuit, and is configured to receive the plurality of state detection signals and the trigger signal, and delay the trigger signal by the first delay value to generate the first delayed output signal, wherein the first delay circuit comprises:
      a second delay element that is configured to receive the trigger signal and delay the trigger signal by a fourth delay value to generate a second delayed signal, wherein the fourth delay value is based on a time duration that is required by the metastability detector circuit to generate the plurality of state detection signals.

9. The fixed-width pulse generator of claim 8, wherein the first delay circuit further comprises:
   a plurality of selection circuits that are coupled in series such that each selection circuit comprises:
      a third delay element that is configured to receive a second input signal and delay the second input signal by a fifth delay value to generate a third delayed signal, wherein the second input signal is at least one of the second delayed signal and a corresponding multiplexer output signal of a previous selection circuit of the plurality of selection circuits that are coupled in series; and
      a multiplexer that is coupled with the third delay element and the metastability detector circuit, and is configured to receive the third delayed signal, a corresponding state detection signal of the plurality of state detection signals, and the second input signal, and select and output one of the third delayed signal and the second input signal based on the corresponding state detection signal, wherein the first delay value is further based on the fourth delay value and a delay associated with each selection circuit, and wherein the delay associated with each selection circuit is based on at least one of the fifth delay value and a delay associated with a corresponding multiplexer of each selection circuit.

10. The fixed-width pulse generator of claim 1, wherein the delay signal generator further comprises:
   a second delay circuit that is coupled with the metastability detector circuit, and is configured to receive the plurality of state detection signals and the trigger signal, and delay the trigger signal by the second delay value to generate the second delayed output signal.

11. The fixed-width pulse generator of claim 10, wherein the second delay circuit comprises:
   a fourth delay element that is configured to receive the trigger signal and delay the trigger signal by a sixth delay value to generate a fourth delayed signal, wherein the sixth delay value is based on a time duration required by the metastability detector circuit to generate the plurality of state detection signals; and
   a plurality of multiplexers that are coupled in series, wherein each multiplexer is coupled with the metastability detector circuit, and is configured to receive a third input signal and a corresponding state detection signal of the plurality of state detection signals, and output the third input signal based on the corresponding state detection signal, wherein the third input signal is at least one of the fourth delayed signal and a corresponding multiplexer output signal of a previous multiplexer of the plurality of multiplexers that are coupled in series, and wherein the second delay value is based on the sixth delay value and a delay associated with the plurality of multiplexers.

12. A system-on-chip (SoC), comprising:
a fixed-width pulse generator comprising:
  a metastability detector circuit that is configured to receive a trigger signal and generate a plurality of state detection signals;
  a delay signal generator that is coupled with the metastability detector circuit, and is configured to receive the plurality of state detection signals and the trigger signal, and delay the trigger signal by first and second delay values to generate first and second delayed output signals, respectively, wherein the first delay value is based on the plurality of state detection signals, and wherein the first and second delay values are different; and
  a combinational logic circuit that is coupled with the delay signal generator, and is configured to receive the first and second delayed output signals and an error signal, and generate a fixed-width pulse, wherein a width of the fixed-width pulse remains constant over process, voltage, and temperature variations; and
a set of one-time-programmable (OTP) elements that is coupled with the combinational logic circuit, and is configured to receive the fixed-width pulse, wherein each OTP element is programmed based on the fixed-width pulse.

13. The SoC of claim 12, further comprising:
a OTP read/write controller that is coupled with the fixed-width pulse generator, and is configured to generate the trigger signal and provide the trigger signal to the fixed-width pulse generator, wherein the metastability detector circuit is triggered to generate the plurality of state detection signals when the trigger signal is activated, and wherein the OTP read/write controller is further configured to receive the error signal that indicates whether the generation of the fixed-width pulse is erroneous or error-free.

14. The SoC of claim 12, wherein the fixed-width pulse generator further comprises:
a sequence qualifier circuit that is coupled with the metastability detector circuit and the combinational logic circuit, and is configured to receive the plurality of state detection signals, generate the error signal based on a sequence of the plurality of state detection signals, and provide the error signal to the combinational logic circuit, wherein the error signal is generated at a logic high state when the sequence of the plurality of state detection signals is erroneous, and at a logic low state when the sequence of the plurality of state detection signals is error-free, and wherein the combinational logic circuit generates the fixed-width pulse when the error signal is at the logic low state.

15. The SoC of claim 14, wherein the combinational logic circuit comprises:
a first logic gate that is coupled with the delay signal generator, and is configured to receive the first and second delayed output signals and generate a pulse output signal;
a second logic gate that is coupled with the sequence qualifier circuit, and is configured to receive the error signal and generate an inverted error signal; and
a third logic gate that is coupled with the first and second logic gates, and is configured to receive the pulse output signal and the inverted error signal, and generate the fixed-width pulse.

16. The SoC of claim 12, wherein the metastability detector circuit comprises:
a plurality of metastability detectors that are coupled in parallel, wherein each state detection signal indicates a metastable state of a corresponding metastability detector of the plurality of metastability detectors, and wherein each metastability detector comprises:
  a first delay element that is configured to receive a first input signal and delay the first input signal by a third delay value to generate a first delayed signal, wherein the first input signal is at least one of the trigger signal and a corresponding delayed signal of a previous metastability detector of the plurality of metastability detectors that are coupled in parallel;
  a fourth logic gate that is configured to receive the trigger signal and generate an inverted trigger signal;
  a plurality of flip-flops that include first and second flip-flops, wherein the first flip-flop is coupled with the first delay element and the fourth logic gate, and is configured to receive the first delayed signal and the inverted trigger signal, and generate a first flop-output signal, and wherein the second flip-flop is coupled with the first delay element, and is configured to receive the first delayed signal and the trigger signal, and generate a second flop-output signal;
  a fifth logic gate that is coupled with the first flip-flop, and is configured to receive the first flop-output signal, and generate an inverted first flop-output signal; and
  a sixth logic gate that is coupled with the fifth logic gate and the second flip-flop, and is configured to receive the inverted first flop-output signal and the second flop-output signal, and generate a corresponding state detection signal of the plurality of state detection signals, wherein when at least one of the first and second flip-flops are in the metastable state, the corresponding state detection signal is generated at a logic low state.

17. The SoC of claim 12, wherein the delay signal generator comprises:
a first delay circuit that is coupled with the metastability detector circuit, and is configured to receive the plurality of state detection signals and the trigger signal, and delay the trigger signal by the first delay value to generate the first delayed output signal, wherein the first delay circuit comprises:
  a second delay element that is configured to receive the trigger signal and delay the trigger signal by a fourth delay value to generate a second delayed signal, wherein the fourth delay value is based on a time duration that is required by the metastability detector circuit to generate the plurality of state detection signals.

18. The SoC of claim 17, wherein the first delay circuit further comprises:
a plurality of selection circuits that are coupled in series such that each selection circuit comprises:
  a third delay element that is configured to receive a second input signal and delay the second input signal by a fifth delay value to generate a third delayed signal, wherein the second input signal is at least one of the third delayed signal and a corresponding multiplexer output signal of a previous selection circuit of the plurality of selection circuits that are coupled in series; and a multiplexer that is coupled with the third delay element and the metastability detector circuit, and is configured to receive the third delayed signal, a corresponding state detection signal of the plurality of state detection signals, and the second input signal, and select and output one of the third delayed signal and the second input signal based on the corresponding state detection signal, wherein the first delay value is further based on the fourth delay value and a delay associated with each selection circuit, and wherein the delay associated with each selection circuit is based on at least one of the fifth delay value and a delay associated with a corresponding multiplexer of each selection circuit.

19. The SoC of claim 12, wherein the delay signal generator further comprises:

a second delay circuit that is coupled with the metastability detector circuit, and is configured to receive the plurality of state detection signals and the trigger signal, and delay the trigger signal by the second delay value to generate the second delayed output signal.

20. The SoC of claim 19, wherein the second delay circuit comprises:

a fourth delay element that is configured to receive the trigger signal and delay the trigger signal by a sixth delay value to generate a fourth delayed signal, wherein the sixth delay value is based on a time duration required by the metastability detector circuit to generate the plurality of state detection signals; and a plurality of multiplexers that are coupled in series, wherein each multiplexer is coupled with the metastability detector circuit, and is configured to receive a third input signal and a corresponding state detection signal of the plurality of state detection signals, and output the third input signal based on the corresponding state detection signal, wherein the third input signal is at least one of the fourth delayed signal and a corresponding multiplexer output signal of a previous multiplexer of the plurality of multiplexers that are coupled in series, and wherein the second delay value is based on the sixth delay value and a delay associated with the plurality of multiplexers.

* * * * *